United States Patent [19]
Singh et al.

[11] Patent Number: 6,011,379
[45] Date of Patent: Jan. 4, 2000

[54] METHOD FOR DETERMINING STATE-OF-CHARGE USING AN INTELLIGENT SYSTEM

[75] Inventors: Pritpal Singh, Media, Pa.; Craig Fennie, Jr., New Haven, Conn.

[73] Assignee: U.S. Nanocorp, Inc., North Haven, Conn.

[21] Appl. No.: 09/041,562

[22] Filed: Mar. 12, 1998

Related U.S. Application Data

[60] Provisional application No. 60/040,356, Mar. 12, 1997, and provisional application No. 60/051,049, Jun. 27, 1997.

[51] Int. Cl.$^7$ .................................................. H01M 10/44
[52] U.S. Cl. .................................... 320/132; 320/DIG. 21
[58] Field of Search .................................. 320/128, 132, 320/134, 136, 148, 149, 150, 151, 152, 156, 157, 158, 159, 161, 162, 164, FOR 130, FOR 134, FOR 138, FOR 142, DIG. 21

[56] References Cited

U.S. PATENT DOCUMENTS

| | | |
|---|---|---|
| 3,720,869 | 3/1973 | Rowlette . |
| 3,895,284 | 7/1975 | Schweizer et al. . |
| 3,984,762 | 10/1976 | Dowgiallo, Jr. . |
| 4,307,330 | 12/1981 | Belot . |
| 4,433,295 | 2/1984 | Zaugg . |
| 4,595,880 | 6/1986 | Patil . |
| 4,638,237 | 1/1987 | Fernandez . |
| 4,677,363 | 6/1987 | Kopmann . |
| 4,743,855 | 5/1988 | Randin et al. . |
| 4,775,827 | 10/1988 | Ijntema et al. . |
| 4,876,513 | 10/1989 | Brilmyer et al. . |

(List continued on next page.)

OTHER PUBLICATIONS

Stoll, M. "Neural Networks—A Proper Approach to the Energy Management Problem," no date.

Jean Alzieu, Hassan Smimite, Christian Glaize, Improvement of intelligent battery controller: state–of–charge indicator and associated functions, Journal of Power Sources 1997 pp. 157–161.

Willaim Ross and Peter Budney, Development of a Battery Runtime Prediction Algorithm and a Method for Determining its Accuracy, IEEE 1995, pp. 277–283.

S.A.G.R. Karunathilaka, R. Leek, N.A. Hampson, M. Hughes and T.J. Sinclair, A state–of–charge test for the Li–CuO cell, Journal of Applied Electrochemistry (1983) pp. 351–354.

S. Sathyanarayana, S. Venugopalan, M.L. Gopikanth, Impedance parameters and the state–of–charge, I. Nickel–cadmium battery, Journal of Applied Electrochemistry (1979) pp. 125–139.

S.A.G.R. Karunathilaka, N. A. Hampson, M. Hughes, W. G. Marshal, R. Leek and T. J. Sinclair, The prediction of the sate–of–charge of some commerical primary cells, Journal of Applied Electrochemistry (1983) pp. 577–586.

S.A.G.R. Karunathilaka, N. A. Hampson, T. P. Haas, W. G. Marshall, R. Leek and T. J. Sinclair, The impedance of the alkaline zinc–mercuric oxide cell. I. Cell behaviour and interpretation of impedance spectra, Journal of Applied Electrochemistry (1981) pp. 573–582.

*Primary Examiner*—Edward H. Tso
*Attorney, Agent, or Firm*—Cantor Colburn LLP

[57] ABSTRACT

A method for determining state of charge (SOC) of an electrochemical device using fuzzy logic (i.e., an intelligent system) is presented. State of charge of an electrochemical device is determined by an internal characteristic or parameter (or external operating and environmental conditions) with an intelligent system. The electrochemical device comprises such devices as primary ("throwaway") batteries, rechargeable batteries, fuel cells, a hybrid battery containing a fuel cell electrode and electrochemical supercapacitors. The intelligent system is trained in the relationship between the characteristic of the electrochemical device and the SOC of the electrochemical device.

39 Claims, 15 Drawing Sheets

U.S. PATENT DOCUMENTS

| | | |
|---|---|---|
| 4,947,123 | 8/1990 | Minezawa . |
| 4,958,127 | 9/1990 | Williams et al. . |
| 5,159,272 | 10/1992 | Rao et al. . |
| 5,241,275 | 8/1993 | Fang . |
| 5,284,719 | 2/1994 | Landau et al. . |
| 5,321,627 | 6/1994 | Reher . |
| 5,349,540 | 9/1994 | Birkle et al. . |
| 5,369,364 | 11/1994 | Renirie et al. . |
| 5,372,898 | 12/1994 | Atwater et al. . |
| 5,381,096 | 1/1995 | Hirzel . |
| 5,404,106 | 4/1995 | Matsuda . |
| 5,451,881 | 9/1995 | Finger . |
| 5,457,377 | 10/1995 | Jonsson . |
| 5,541,489 | 7/1996 | Dunstan . |
| 5,587,660 | 12/1996 | Chabbert et al. . |
| 5,614,829 | 3/1997 | Song . |
| 5,631,540 | 5/1997 | Nguyen . |
| 5,654,903 | 8/1997 | Reitman et al. . |
| 5,656,919 | 8/1997 | Proctor et al. . |
| 5,659,240 | 8/1997 | King . |
| 5,670,861 | 9/1997 | Nor . |
| 5,696,439 | 12/1997 | Presti et al. ............................ 323/282 |
| 5,701,078 | 12/1997 | Lee et al. . |
| 5,705,929 | 1/1998 | Caravello et al. . |
| 5,714,866 | 2/1998 | S et al. ................................... 320/152 |
| 5,739,672 | 4/1998 | Lane ....................................... 320/139 |
| 5,773,956 | 6/1998 | Wieczorek ............................ 320/152 |

METHOD FOR DETERMINING STATE-OF-CHARGE USING AN INTELLIGENT SYSTEM

CROSS REFERENCE TO REED APPLICATIONS

This application claims the benefit of U.S. provisional patent application Ser. No. 60/040,356 filed Mar. 12, 1997 and U.S. provisional patent application Ser. No. 60/051,049 filed Jun. 27, 1997.

BACKGROUND OF THE INVENTION

The present invention relates to determining state of charge of an electrochemical device. More particularly, the present invention relates to determining state of charge of an electrochemical device using an intelligent system, e.g., a fuzzy logic system.

Presently there are three basic approaches to determining the state of charge (SOC) of batteries, Coulomb counting, response of a battery to an applied load, and batter impedance measurements.

The Coulomb counting approach involves the measurement of charge flow out of the battery into the load and charge flow from a battery charger to the battery. The Cumulative charge removed from the battery is used to estimate the battery's SOC with or without corrections being made for changes in battery capacity with discharge rate and battery temperature. The corrections to battery capacity made to compensate for battery temperature and discharge rate variations are performed using semi-empirical equations, such as the Peukert equation, as demonstrated by U.S. Pat. No. 5,656,919. Other analytical equations used to adjust the battery SOC for discharge rate and battery temperature were reported by Alzieu et al in Journal of Power Sources 67 pp. 157–161 (1997). Another approach to coulomb counting is to use actual battery data stored in lookup tables to adjust for the battery SOC variation with discharge rate and battery temperature. A good example of this method is provided in U.S. Pat. No. 5,372,898. Another example of this approach was presented by Freeman and Heacock in the High Frequency Power Conversion 1994 Conference Proceedings pp. 231–241 (April 1994). These methods are commonly used in portable electronic applications but do not always work well in the case of variable loads. They are also not particularly accurate when interpolating between the data available in the lookup tables.

The response of a battery to a load can be used to determine battery SOC. By observing the voltage of the battery before, during, and after the application of a load, the battery response to the load may be used to determine the battery SOC. One example of this approach was presented by Peled in U.S. Pat. No. 4,275,784. This patent describes a means of inferring the SOC of lithium batteries by using the battery temperature and the temporal voltage recovery profile of a battery after the removal of a fixed load on a battery, by comparison with reference tables for the given temperature and voltage recovery characteristics. A similar approach has been reported by Finger in U.S. Pat. No. 4,460,870. These methods like the Coulomb counting methods above do not necessarily provide reliable interpolation between the conditions at which the batteries have been previously calibrated.

It is well known that the measurement of the internal impedance of a battery may be used to determine the battery's state of charge (SOC). U.S. Pat. No. 3,562,634 describes a technique where the capacitances of nickel-cadmium batteries are used to determine the SOC of these batteries. This approach, however, is awkward to implement because it requires a standard reference curve to be used for comparing the measured capacitance in order to infer the battery's SOC.

Several patents, including U.S. Pat. Nos. 4,678,998, 5,241,275, 5,650,937, and 5,369,364, and publications including Journal of Applied Electrochemistry, Blanchard, 22 pp. 1121–11128 (1992), Journal of Applied Electrochemistry, Viswanathan et al., 9 pp. 125–139 (1979), Journal of Applied Electrochemistry, Karunithalaka et al., 13 pp. 577–586 (1983), and Doctoral Dissertation of John Weckesser, entitled An Evaluation of the Electrochemical Properties of Metal Hydride Alloys For Rechargeable Battery Applications, Rutger University (1993) describe different extraction techniques for determining the SOC of a battery having measured the complex internal impedance of the battery at various frequencies. These methods are cumbersome, computationally intensive, and difficult to automate. Also, battery-to-battery variation can be large enough that these techniques become unreliable.

Another approach to determining battery SOC from battery impedance measurements is described in U.S. Pat. No. 3,984,762. This patent describes a means for measuring the phase angle of the complex impedance of a battery and a method for correlating this information with the battery's SOC. Although this method is relatively easy to implement, it is of limited value in that many batteries do not have a consistent correlation between the phase angle of their internal complex impedance and battery SOC.

U.S. Pat. No. 4,743,855 describes an analytical method for determining battery SOC simply by measuring the battery's complex internal impedance at only two frequencies. This considerably simplifies the required electronic circuitry and required computation compared to having to measure the battery's complex internal impedance at many frequencies. Although, this analytical method may work reasonably well for some primary batteries, it is not well suited for rechargeable batteries.

U.S. Pat. No. 5,132,626 a method is described whereby the internal impedance is measured at a single frequency and the battery SOC inferred from this measurement. The drawback of this approach, in general, is the difficulty in finding a single frequency at which the magnitude of the complex internal impedance of the battery correlates well with the battery's SOC.

SUMMARY OF THE INVENTION

The above-discussed and other drawbacks and deficiencies of the prior art are overcome or alleviated by the method for determining state of charge (SOC) of an electrochemical device using an intelligent system, e.g., a fuzzy logic system, of the present invention. In accordance with the present invention, the state of charge of an electrochemical device is determined by an internal characteristic parameters (or external operating and environmental conditions) with an intelligent system. The electrochemical device comprises such devices as primary ("throwaway") batteries, rechargeable batteries, fuel cells, a hybrid battery containing a fuel cell electrode and electrochemical supercapacitors. The intelligent system is trained in the relationship between the characteristic and the related.

The intelligent system comprises any system that adaptively estimates or learns continuous functions from data without specifying how outputs depend on inputs. By way of example, the intelligent system includes an artificial neural system, a fuzzy system and other such model-free function estimators that learn. Learning, so-called, "tunes" an intelligent system. This learning process (also referred to as a training process) can be implemented in many ways. The intelligent system can be implemented using: an algorithm such as gradient descent and clustering used to tune neural networks and adaptive fuzzy systems; search optimization techniques such as those used by genetic algorithms; or an expert's guesses or trials and errors such as those used in fuzzy expert systems and fuzzy systems.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE INVENTION

Figure 1:
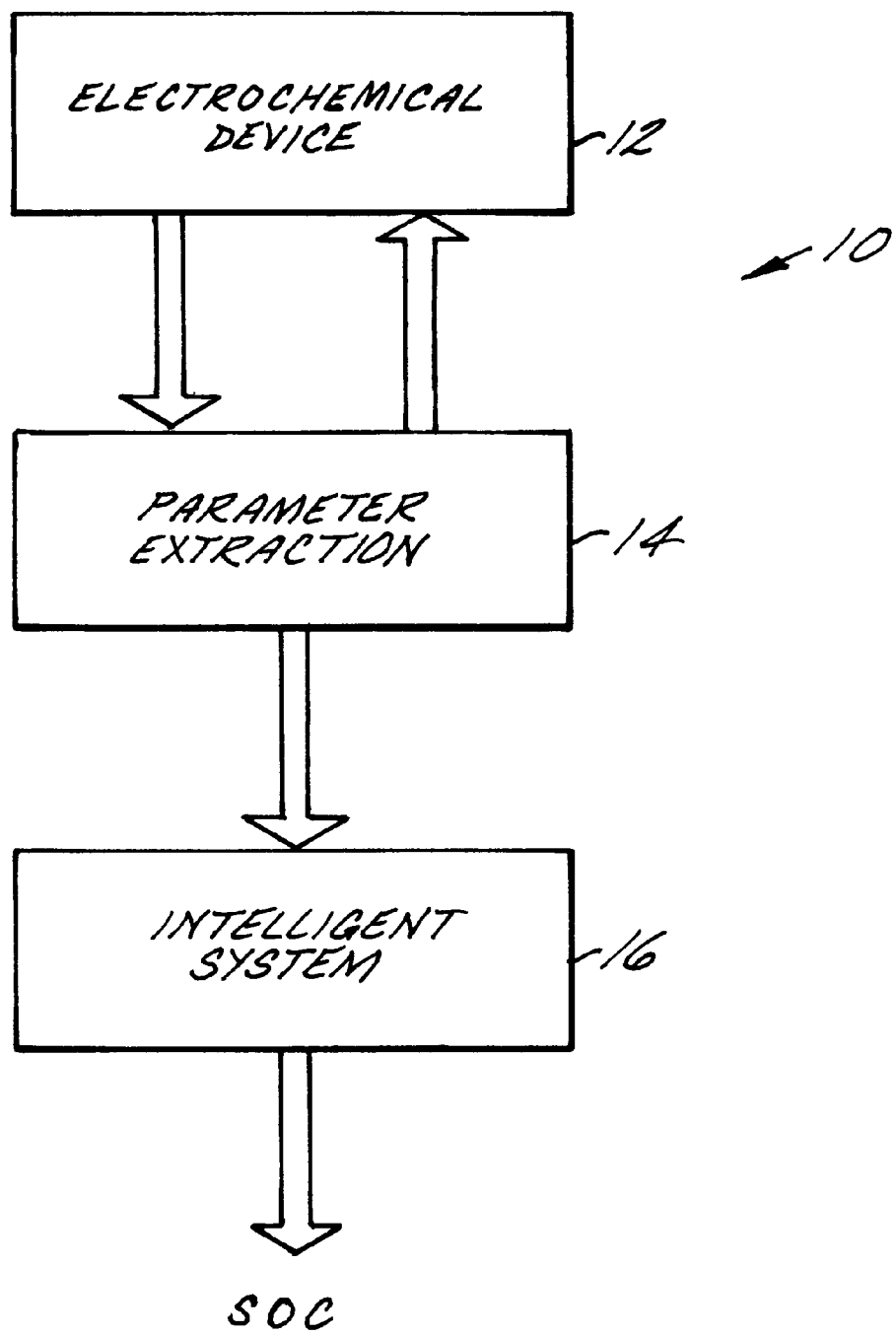
FIG. 1 is a block diagram of a method for determining state of charge of an electrochemical device in accordance with the present invention.

Referring to FIG. 1, a system for determining State-of-Charge (SOC) in accordance with the present invention is generally shown at 10. System 10 comprises an electrochemical device 12 for which SOC is to be determined, a parameter extraction device 14 and an intelligent system 16. Electrochemical device 12 comprises such devices as primary ("throwaway") batteries, rechargeable batteries, fuel cells, a hybrid battery containing a fuel cell electrode and electrochemical supercapacitors. Intelligent system 16 is trained in the relationship between characteristic parameters of electrochemical device 12 and its SOC. These characteristic parameters are obtained by device 14 and provided to intelligent system 16 as inputs, with the SOC being the output of intelligent system 16.

Intelligent system 16 comprises any system that adaptively estimates or learns continuous functions from data without specifying how outputs depend on inputs, such as described in Neural Networks and Fuzzy System, by Bart Kosko, Prentice-Hall, 1992, which is incorporated herein by reference. By way of example, intelligent system 16 includes, but is not limited to, an artificial neural system, a fuzzy system and other such model-free function estimators that learn. Learning, so-called, "tunes" an intelligent system. The learning process (also referred to as a training process) can be implemented in many ways. Intelligent system 16 can be implemented using an algorithm such as gradient decent and clustering used to tune neural networks and adaptive fuzzy systems, such as described in Neural Networks and Fuzzy System, by Bart Kosko, Prentice-Hall, 1992. Intelligent system 16 can also be implemented using search optimization techniques such as those used by genetic algorithms, see Genetic Algorithm and Fuzzy Logic System, Soft Computing Perspective (Advances in Fuzzy Systems—Applications and Theory, Vol. 7), by Elie Sanchez et al, World Scientific Pub. Co., 1997, which is incorporated herein by reference. Alternatively, intelligent systems 6 can be implemented by an expert's guesses or trials and errors such as those used in fuzzy expert systems and fuzzy systems, see Fuzzy Logic With Engineering Applications, by Timothy J. Ross, McGraw Hill, 1995, which is incorporated herein by reference. It will be appreciated that combinations of the above may also be employed, such as a fuzzy system/adaptive fuzzy system that uses gradient decent and/or clustering to develop an initial fuzzy system, then uses an expert's knowledge to fine tune the system, see Fuzzy Engineering, by Bart Kosko, Prentice-Hall, 1997, which is incorporated herein by reference.

Figure 2:
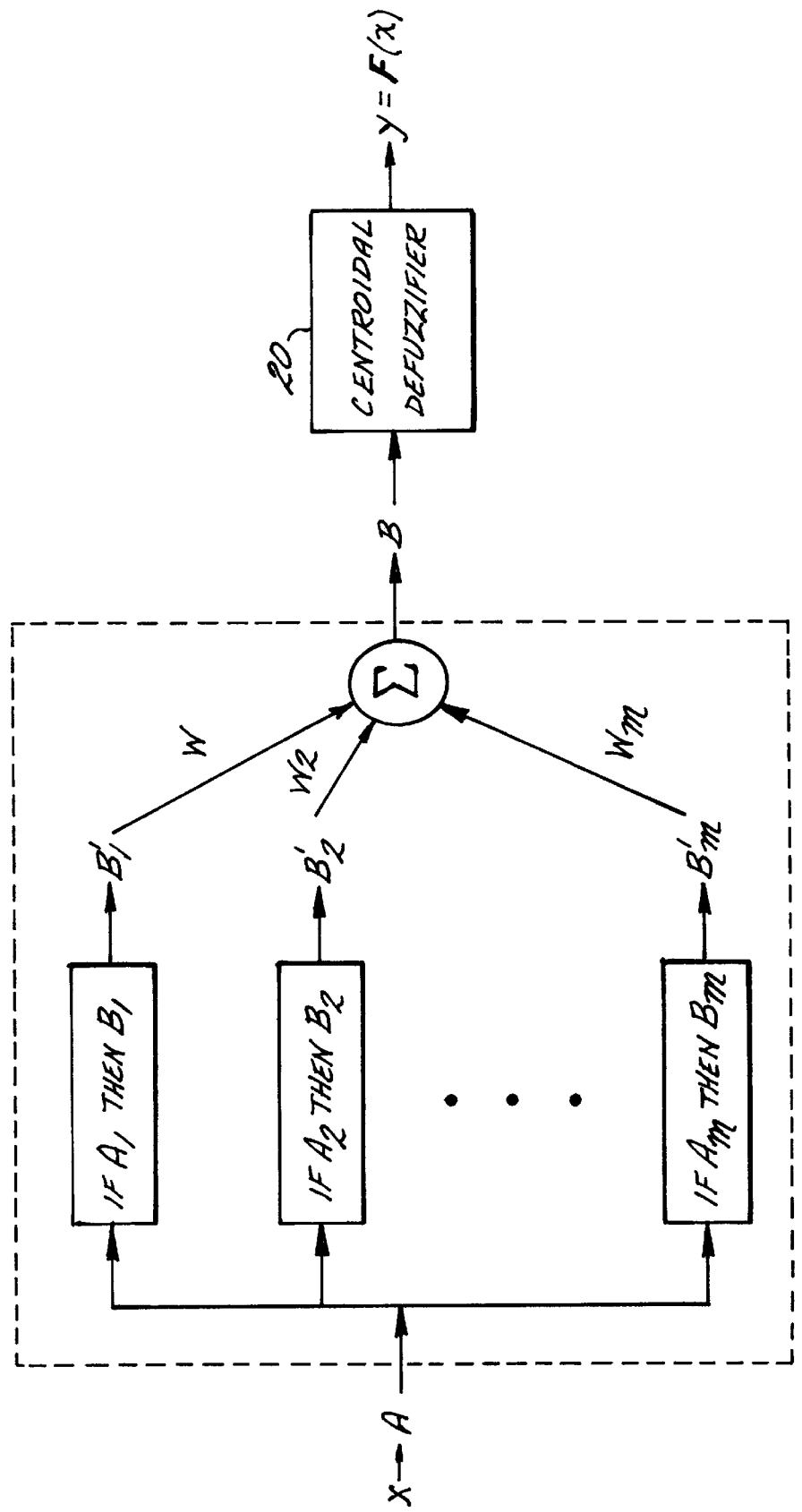
FIG. 2 is a block diagram of an additive fuzzy system for use in the intelligent system of the present invention.

Referring to FIG. 2, intelligent system 16 in a preferred embodiment comprises an additive fuzzy system 18 with centroid defuzzification 20. Additive fuzzy system 18, F, stores ni fuzzy rules of the form, "If X is $A_j$ then Y is $B_j$", and computes the output F(x) as the centroid of the summed and partially fired then-part fuzzy sets $B'_j$, see Fuzzy Engineering, by Bart Kosko, Prentice-Hall, 1997. Mathematically additive fuzzy system 18 is expressed by Equation 1 as:

$$F(x) = \frac{\sum_{j=1}^{m} w_j a_j(x) V_j c_j}{\sum_{j=1}^{m} w_j a_j(x) V_j} \quad \text{EQUATION 1}$$

$$a_j(x) = \prod_{i=1}^{n} a^i_j(x_i) \quad \text{EQUATION 2}$$

-continued $$B = \sum_{j=1}^{m} w_j B'_j = \sum_{j=1}^{m} w_j a_j(x) B_j \quad \text{EQUATION 3}$$

where:

$w_j$ is a weight of rule j, $a_j^i$ represents if-part set function (membership function of input i of rule j on input i), $a_j$ represents joint if-part set function (result of "$a_j^1$ 'and' $a_j^2$ ... 'and' $a_j^i$") that states the degree to which the input x belongs to the if-part fuzzy set $a_j$, $B_j$ represents then-part set function (membership function j on the output), $V_j$ is the finite positive volume (or area) of the then-part set $B_j$, $c_j$ is the centroid of the then-part set $B_j$, $B'_j$—scaled then-part set (scaled output membership function j, result of $a_j(x)B_j$), and B—output set prior to defuzzification.

In linguistic terms, additive fuzzy system 18 can be described in terms of a set of if-then rules:

RULE 1: If $X_1$ is $a^1_1$ and $X_2$ is $a^2_1$ ... and $X_n$ is $a^n_1$, then F(X) is $B_1$, RULE 2: If $X_1$ is $a^1_2$ and $X_2$ is $a^2_2$ ... and $X_n$ is $a^n_2$, then F(X) is $B_2$, RULE m: If $X_1$ is $a^1_m$ and $X_2$ is $a^2_m$ ... and $X_n$ is $a^n_m$, then F(X) is $B_m$, where m is the number of rules and n is the number of inputs.

The linguistic description and the mathematical description of additive fuzzy system 18 are equivalent. They are merely different views of the same fuzzy system. Both approaches map a given input X to a given output F(X) by a process known as fuzzy inference. The following example demonstrates the fuzzy inference process. First, fuzzify the inputs by taking the inputs and determine the degree to which they belong to each of the appropriate input fuzzy sets via membership functions. Mathematically expressed as: "$a_1^1(X_1), a_1^2(X_2), \ldots, a_1^m(X_m)$". Linguistically expressed as: "IF $X_1=a_1^1$, If $X_2=a_1^2, \ldots,$ IF $X_m=a_1^{m''}$. Second, apply a fuzzy operator by combining if-part sets of a given rule to obtain one number that represents the result of the antecedent for that rule. Mathematically expressed as EQUATION 2 hereinabove. Linguistically expressed as: "$a_1^1$ 'and' $a_1^2$ 'and' $a_1^{m''}$" where 'and' is the T-norm product. Third, apply an implication method by shaping the consequent (or output fuzzy set) based on the result of the antecedent for that rule. Mathematically expressed as: "$B_1=a_1(X)B_1$". Linguistically expressed as: "If $a_1(X)$, then $B_1$". Fourth, aggregate all outputs by combining the consequent of each rule to form one output fuzzy set. Mathematically expressed as EQUATION 3 hereinabove. Fifth, defuzzify by mapping the output fuzzy set to a crisp number. Mathematically expressed as "F(x)=centroid(B)=EQUATION 1". In general see Fuzzy Logic TIoolbox, for use with MATLAB, The Mathworks, Inc. by Jang and Gulley.

By way of example, a supervised gradient descent, can learn or tune additive fuzzy system 18 given by EQUATION 1 by changing the rule weights $w_j$, the then-part volumes $V_j$, the then-part centroids $c_j$, or the if-part set functions $a_j$.

Figure 3:
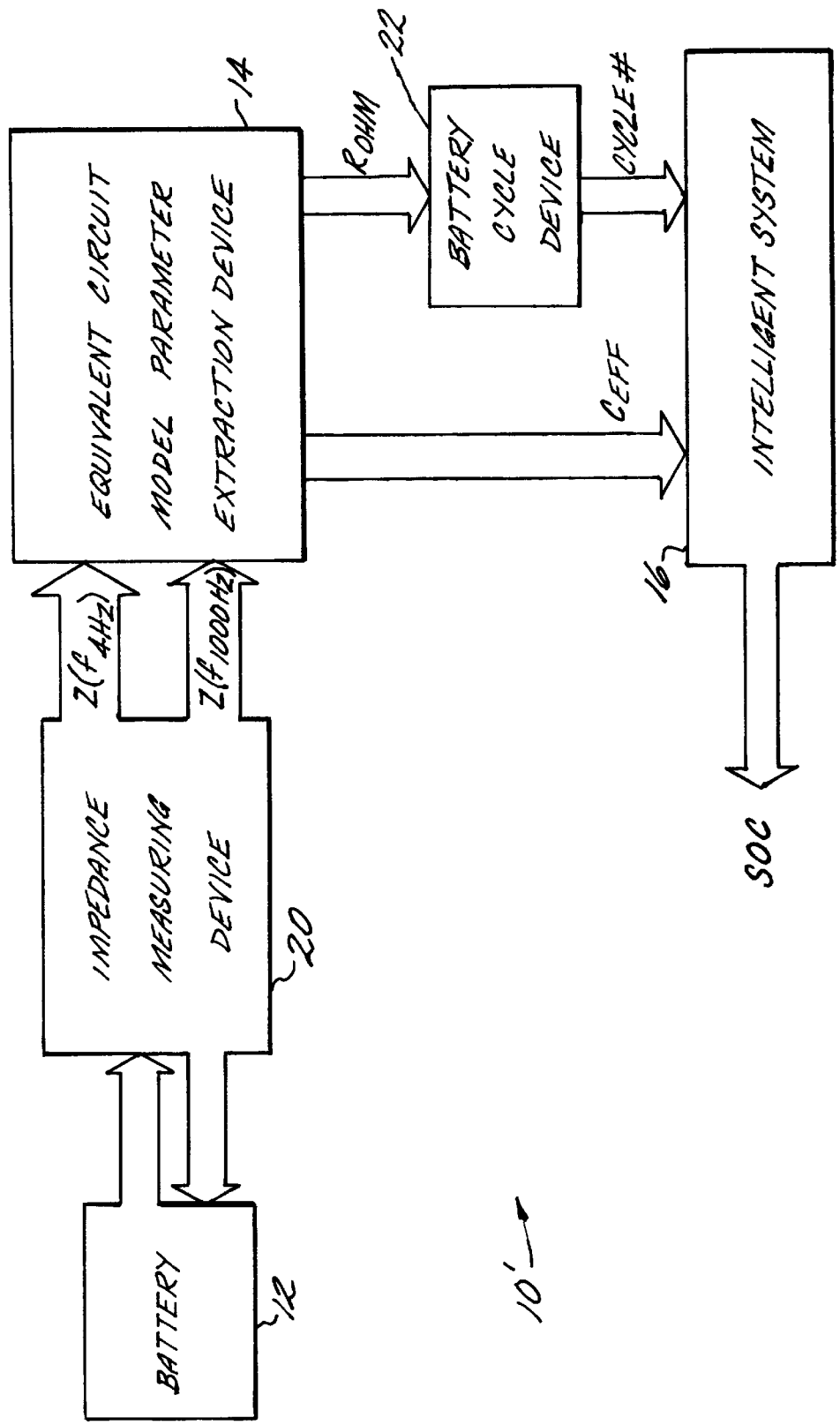
FIG. 3 is a block diagram of a method for determining state of charge of an electrochemical device in accordance with an embodiment of the present invention.

Referring to FIG. 3, system 10 determines the SOC of a battery 12 by relating the internal electrical characteristics of a battery to its SOC. In the preferred embodiment the internal electrical characteristic parameter extraction device comprises an impedance measuring device 20. System 10 comprises battery 12 for which the SOC is to be determined, an impedance measuring device 20, a preprocessor and intelligent system 16. In the preferred embodiment the preprocessor comprises an equivalent circuit parameter extraction device and a battery cycle device.

Figure 4A:
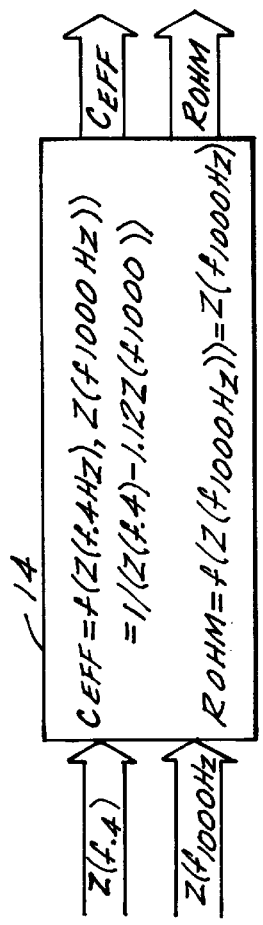
FIG. 4A is a schematic diagram of a circuit for measuring battery impedance.

Referring to FIG. 4A, a circuit 24 for measuring battery impedance is shown. Circuit 24 comprises battery 12 whose impedance is to be measured, an a.c. voltage generator 26 of variable frequency, and a d.c. variable voltage generator 28. Battery 12 and generators 26 and 28 are connected in series in any order but in such a way that battery 12 and the d.c. generator 28 have in common poles of the same sign, in this example the positive poles. The no-load voltage of battery 12 is designated as $E_0$, the effective voltage of a.c. generator 26 is designated as V and the voltage of d.c. generator 28 is designated as E. Voltage E is chosen so as to be equal to $E_0$ to prevent battery 12 issuing a direct current. In this way, the current flowing in the loop made up of battery 12 and generators 26 and 28 has no direct component and its alternating component designated I is determined by the voltage V. Variables V and I are complex numbers and their ratio V/I=Z=Z'+jZ" defines the internal complex impedance of battery 12. This impedance has a real or resistive part Z' and an imaginary or reactive part Z". The magnitude of this impedance, |Z|, is given by $|Z|=(Z'^2+Z''^2)^{1/2}$. The battery impedance is a function of the frequency f of the a.c. voltage. In some cases, the battery impedance at a particular frequency also changes with the battery's cycle number. A fully charged battery that is discharged and then recharged to its original state is said to have gone through a complete battery cycle. A battery's cycle number is the cumulative number of cycles that the battery has gone through.

Figure 4B:
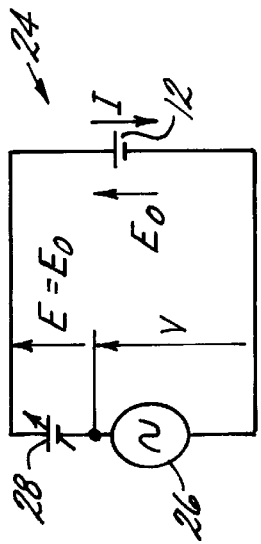
FIG. 4B is a block diagram of an equivalent circuit model characteristic parameter extraction device of FIG. 3.

Referring now to FIG. 4B, equivalent circuit model characteristic parameters extraction device 14 is shown for extracting electrical parameters from the impedance data (i.e., $Z(f_{.4HZ}), Z(f_{1000HZ})$). It has been determined that in the case of nickel metal hydride batteries, the battery impedance measured at a frequency of 1000 Hz correlates well with the battery cycle number above about 100 cycles, see Doctoral Dissertation of John Weckesser, entitled An Evaluation of the Electrochemical Properties of Metal I4ydride Alloys For Rechargeable Battery Applications, Rutger University (1993), which is incorporated herein by reference.

Figure 4C:
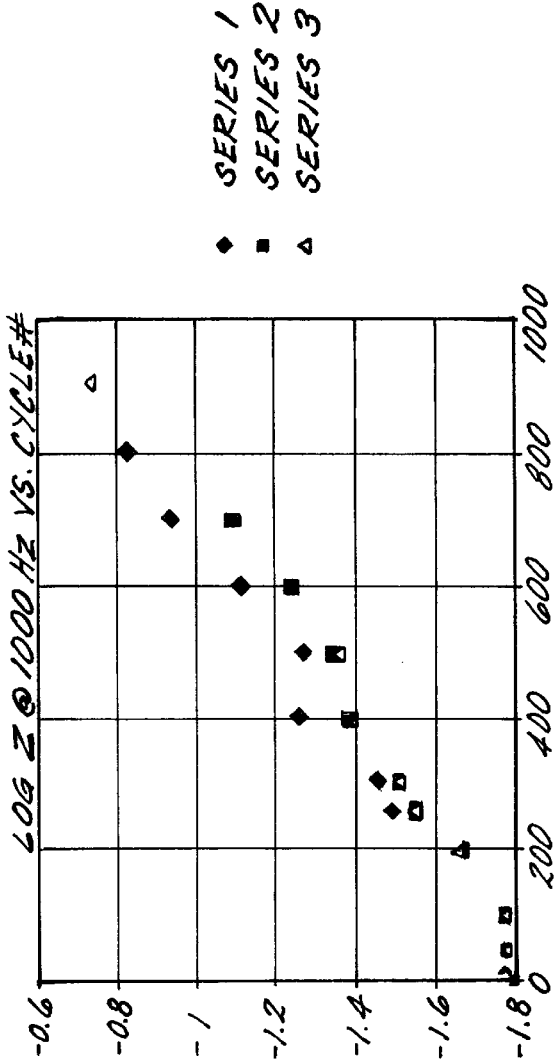
FIG. 4C is a plot of the log of the impedance versus battery cycle number.

Referring to FIG. 4C, variation of the logarithm of the impedance (log Z) with battery cycle number for a nickel metal hydride battery is shown. This data allows determination of the battery cycle number (independently of battery state of charge) above about 100 cycles. Further, series capacitance of nickel metal hydride batteries varies with both cycle number and battery state of charge. Also, the values of the series capacitance of the nickel metal hydride batteries can be determined by measuring the internal impedance of the batteries at many frequencies and using a circuit model with different circuit elements to fit the complete impedance spectrum., again see Doctoral Dissertation of John Weckesser, Rutger University (1993).

Figure 5:
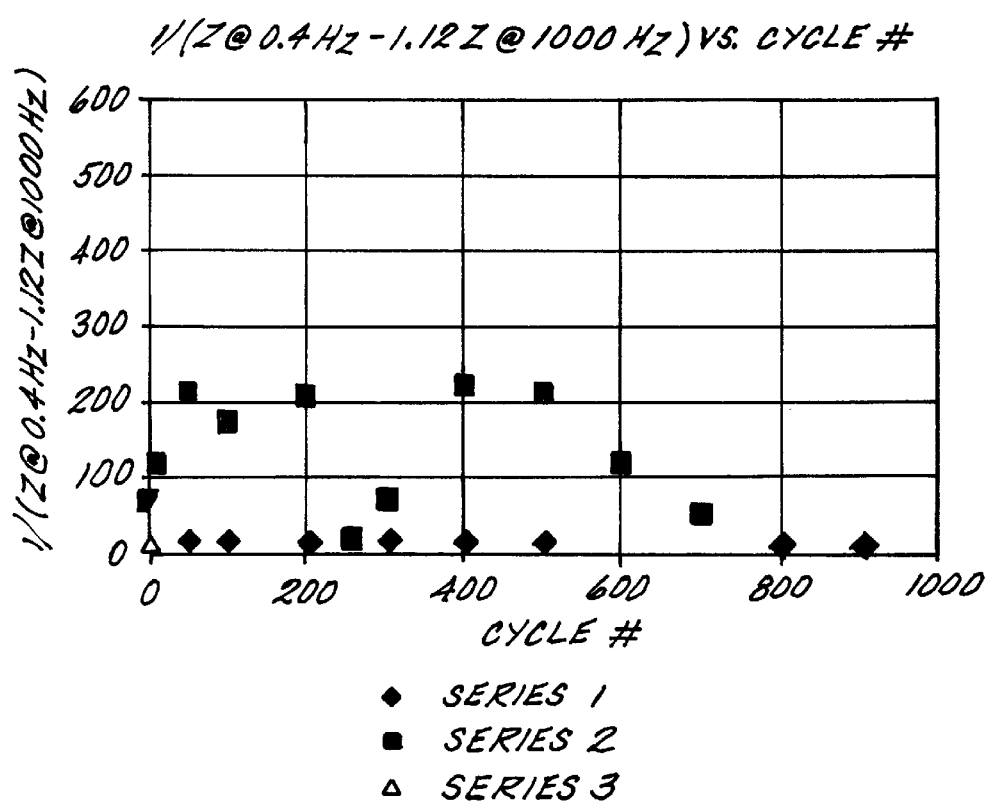
FIG. 5 is a plot of impedance function as a function of SOC versus Cycle #.

In accordance with the present invention, an effective series capacitance value can be determined by a simple analysis of the battery impedance measured at two frequencies. The effective series capacitance is obtained by measuring the impedance of the battery at 0.4 Hz and measuring the impedance at 1000 Hz. The effective series capacitance is given by the expression $C_{eff}=1/(Z(f_{.4HZ})-1.12\ Z(f_{1000HZ}))$. A plot of this function is shown in FIG. 5, wherein a similar functional relationship to the battery cycle number and battery state of charge is found. This is used by system 10' to determine battery 12 state of charge (SOC) given battery 12 impedance measurements made at 0.4 Hz and 1000 Hz.

Figure 6:
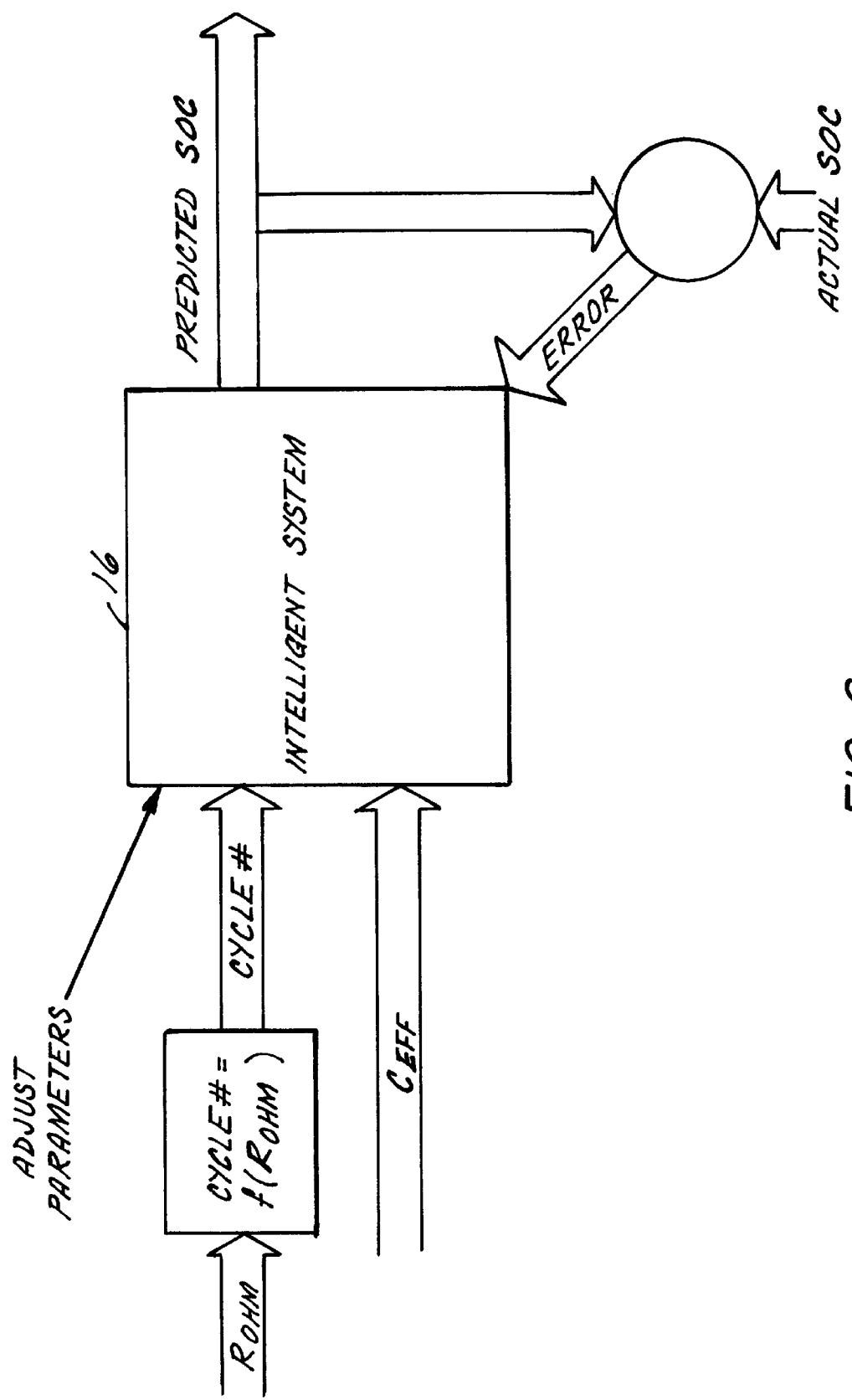
FIG. 6 is a block diagram of an intelligent system for use in determining state of charge of the present invention.

Referring to FIG. 6, intelligent system 16 is trained in the relationship between equivalent circuit model internal electrical characteristic parameters and the SOC of the battery, whereby the intelligent system 16 learns the underlying function f that relates $C_{eff}$ and Cycle #($f_{rc}(R_{ohm})$) to SOC.

Figure 7:
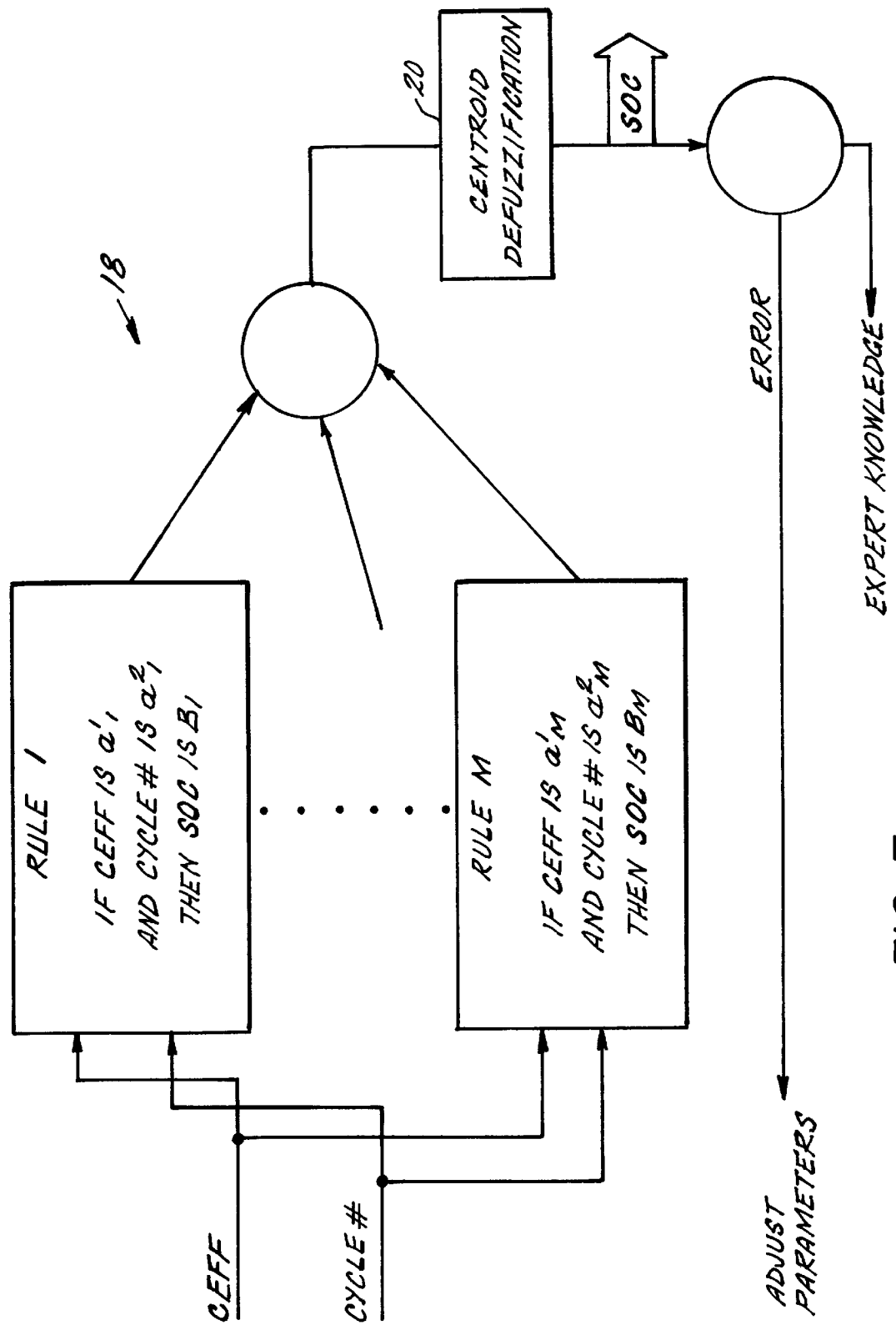
FIG. 7 is a block diagram of an additive fuzzy system for use in the intelligent system of the present invention.
Figure 8A:
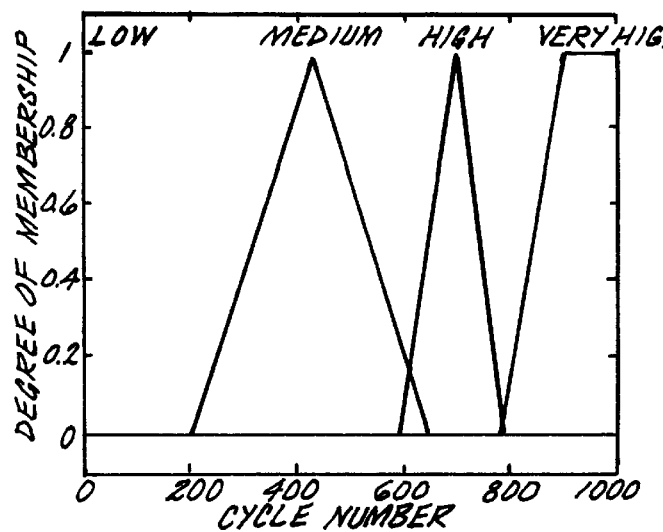
FIGS. 8A–C are plots of membership functions for the fuzzy system of FIG. 7.
Figure 8B:
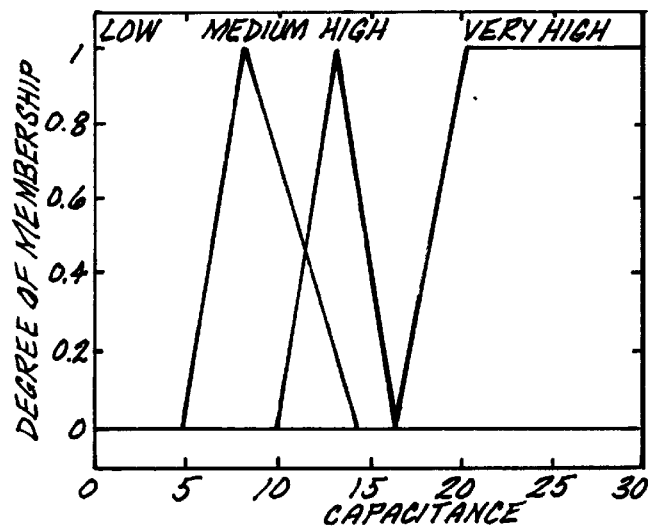
Figure 8C:
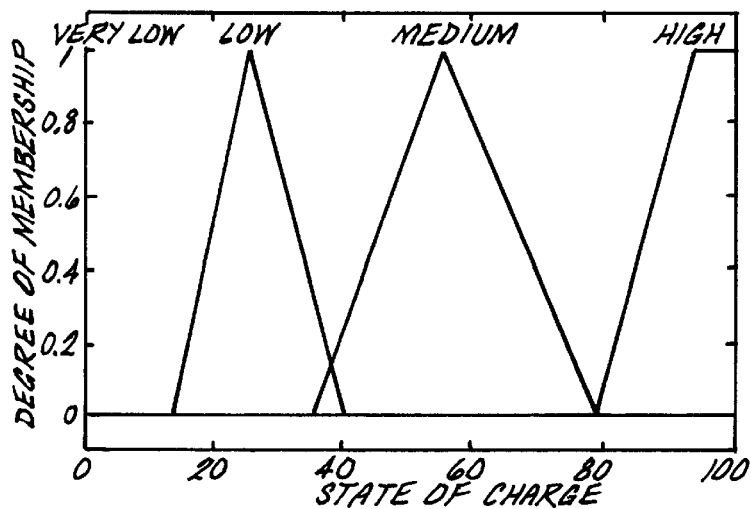

Referring to FIG. 7, additive fuzzy system 18 learns the relationship between input variables, $C_{eff}$ and Cycle #, and output variables, battery SOC, by use of an expert knowledge and trials and errors. It will be appreciated that any learning method previously discussed can be used to tune the fuzzy system. Also that any intelligent system previously mentioned can be employed in place of the additive fuzzy system. Input membership functions for the fuzzy system are shown in FIGS. 8A and B and the output membership functions are shown in FIG. 8C. There are four membership functions for the cycle #, four membership functions for the effective series capacitance $C_{eff}$, and four membership functions for the SOC of battery 12. The following rules are applied:

Rule 1. If (Cycle_Number is Low) and (Capacitance is Low) then (State_of_Charge is Very Low) (1)
Rule 2. If (Cycle_Number is Low) and (Capacitance is Medium) then (State_of_Charge is Low) (1)
Rule 3. If (Cycle_Number is Low) and (Capacitance is High) then (State of Charge is High) (1)
Rule 4. If (Cycle_Number is Low) and (Capacitance is Very_High) then (State_of_Charge is High) (1)
Rule 5. If (Cycle Number is medium) and (Capacitance is Low) then (State__of_Charge is Very Low)(1)
Rule 6. If (Cycle Number is medium) and (Capacitance is medium) then (State_of_Charge is Low) (1)
Rule 7. If (Cycle_Number is medium) and (Capacitance is High) then (State_of_Charge is medium) (1)
Rule 8. If (Cycle_Number is medium) and (Capacitance is Very_High) then (State_of_Charge is High) (1)
Rule 9. If (Cycle Number is high) and (Capacitance is Low) then (State_of_Charge is Very_Low)
Rule 10. If (Cycle_Number is high) and (Capacitance is medium) then (State_of_Charge is medium) (1)
Rule 11. If (Cycle_Number is high) and (Capacitance is High) then (State_of_Charge is High) (1)
Rule 12. If (Cycle_Number is high) and (Capacitance is Very_High) then (State_of_Charge is High) (1)
Rule 13. If (Cycle_Number is very high) and (Capacitance is Low) then (State_of_Charge is Low)(1)
Rule 14. If (Cycle_Number is very_high) and (Capacitance is medium) then (State_of_Charge is High)
Rule 15. If (Cycle Number is very high) and (Capacitance is High) then (State_of_Charge is High) (1)

It will be appreciated that the SOC of battery 12 is really a function of the complex impedance and that the parameters, $C_{eff}$ and $R_{ohm}$, are useful in developing a circuit model of battery 12. The direct relationship between the complex impedance and SOC follows:

$$SOC = f(C_{eff}, \text{Cycle \#}) \qquad \text{EQUATION 4}$$

$$C_{eff} = f(Z(f_4), Z(f_{1000})) = \frac{1}{Z(f_4)} - 1.12Z(f_{1000}), \qquad \text{EQUATION 5}$$

$$\text{Cycle \#} = f_{rc}(R_{ohm}) = f_{rc}(f(Z(f_{1000}))) = f_{rc}(Z(f_{1000})) \qquad \text{EQUATION 6}$$

therefore, $$SOC = f(Z(f_4), Z(f_{1000})) \qquad \text{EQUATION 7}$$

Intelligent system 16 may be trained directly in the relationship between the impedance, $Z_{.4Hz}$ and $Z_{1000Hz}$, and SOC. It will be appreciated that the present embodiment is not dependent upon the impedance at the particular frequencies, 0.4 Hz and 1000 Hz, such being merely exemplary.

Figure 9A:
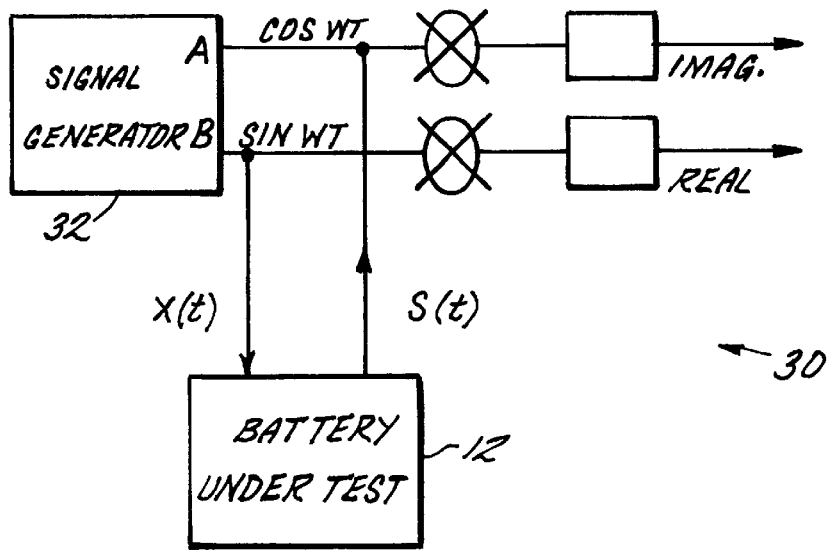
FIG. 9A is a circuit block diagram for determining battery impedance in accordance with the present invention.

Referring to FIG. 9A, a circuit 30 for measuring impedance of battery 12 at two frequencies is generally shown. Circuit 30 comprises battery 12 whose impedance is to be measured and an a.c. signal generator 32. A small amplitude, perturbing sinusoidal signal, $x(t) = X_0 \sin(\omega t)$, is applied to battery 12. The response of battery 12 to this perturbing signal is $S(t) = X_0 K(\omega)\sin(\omega[t+\phi(\omega)])$ and is correlated with two reference signals, one in phase with x(t) and the other 90° out of phase with x(t), i.e., $\sin(t\omega)$ and $\cos(\omega t)$, in order to calculate:

$$\Re = \frac{1}{T} \int_0^T S(t) \sin\omega t\, dt \qquad \text{EQUATION 8}$$

$$\Im = \frac{1}{T} \int_0^T S(t) \cos\omega t\, dt \qquad \text{EQUATION 9}$$

This allows the elimination of higher order harmonics than the fundamental and with an appropriate selection of a frequency window and multiple measurements, noise rejection can be very high. In the limit as $$T \to \infty\ \Re \to K(\omega)\cos\phi(\omega), \Re \to K(\omega)\sin\phi(\omega),$$

where $K(\omega)$ represents the amplitude of the impedance at frequency $\omega/2\pi$ and $\phi(\omega)$ represents the phase of the impedance at frequency $\omega/2\pi$. Circuit 30 allows the determination of the impedance at different frequencies and may be set up to measure the impedance at the two frequencies of interest, such an instrument which can be used to perform the impedance measurements is commercially available as the Solartron 1260 Impedance/Gain-Phase Analyzer.

Figure 9B:
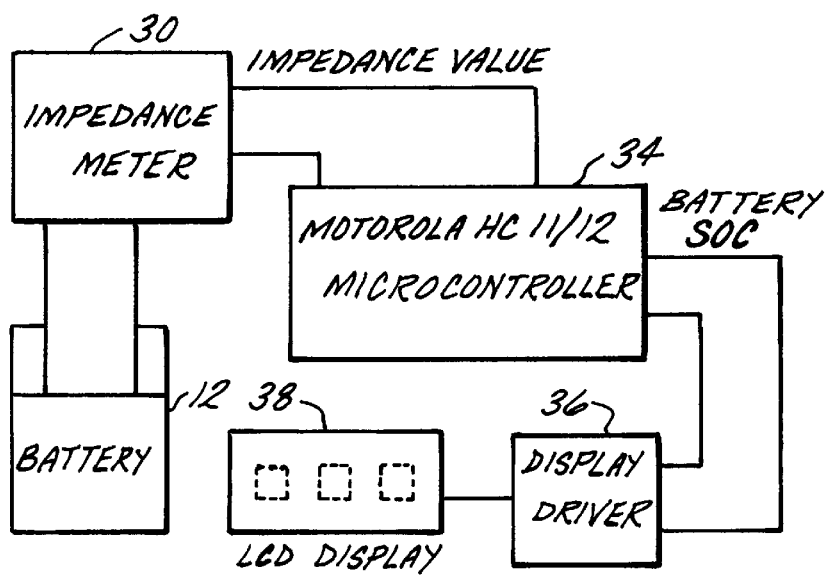
FIG. 9B is a circuit block diagram for determining state of charge in accordance with the present invention.

To determine battery SOC once the impedance is known, a circuit 34 (FIG. 9B) may be used. The impedance values at the two frequencies from circuit 30 are fed into a microcontroller 34 (e.g., Motorola MC68HC11/12) either as analog or digital signals, analog signals would be fed into the A/D converters on microcontroller 34 where they would be converted to digital signals. The impedance at 1000 Hz., $Z_1$, is stored in a first memory location and the impedance at 0.4 Hz., $Z_2$, is stored at a second memory location. The impedance $Z_2$ is then multiplied by a factor of, e.g., 1.12 in microcontroller 34 and the result stored in a third memory location. The difference between $Z_1$ and $1.12 \times Z_2$ is then calculated in microcontroller 34 and the difference stored in a fourth memory location. The inverse of this quantity located in the fourth memory location is then calculated and the result stored in a fifth memory location. The impedance at 1000 Hz stored in the first memory location and the impedance stored in the fifth memory location serve as the input variables for the fuzzy system to determine battery 12 state of charge, as described above. The battery state of charge is then output to a display driver 36 and interfaced to a liquid crystal display 38.

Figure 10:
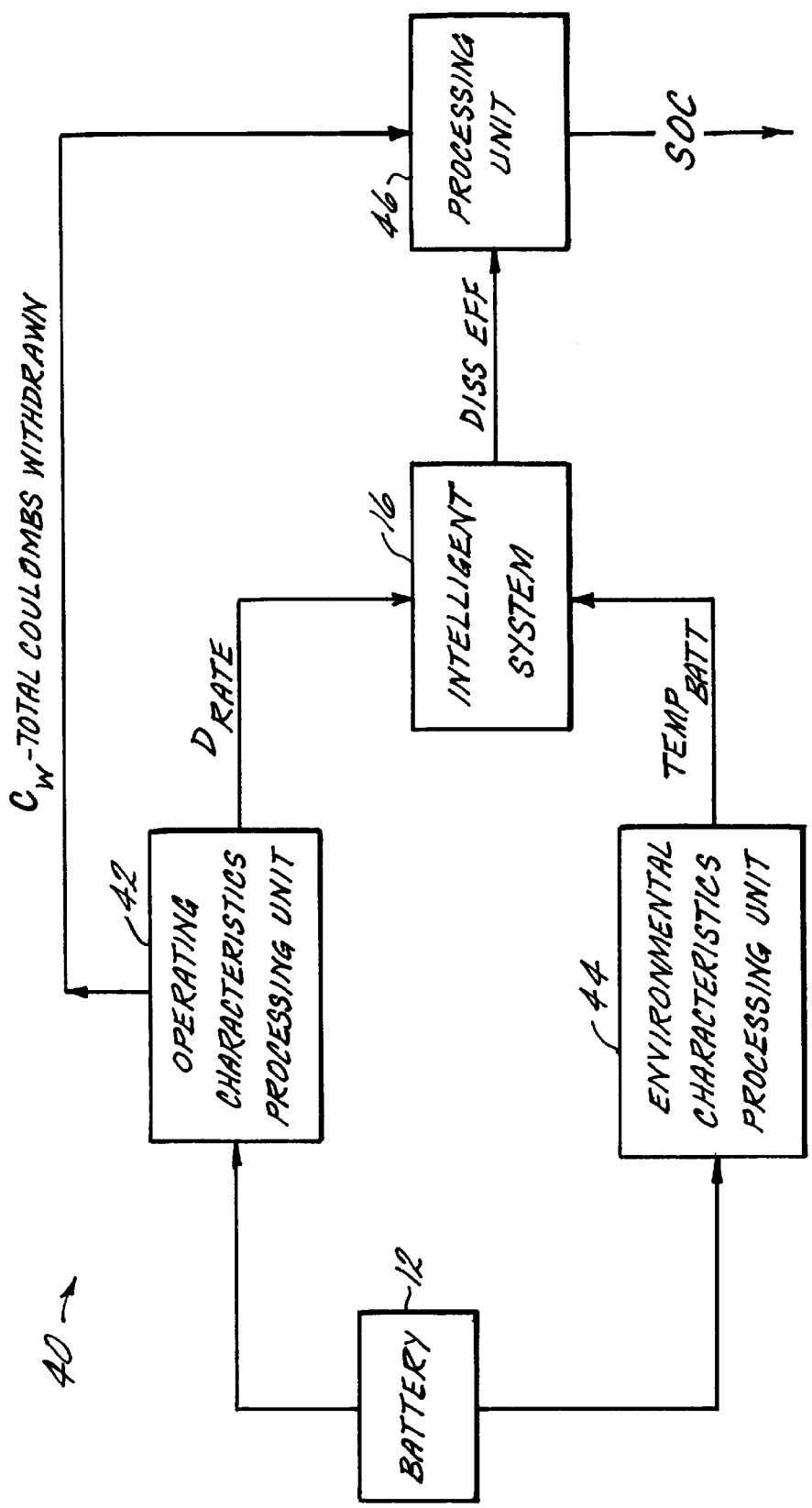
FIG. 10 is a block diagram of a method for determining state of charge of an electrochemical device in accordance with another embodiment of the present invention.

Referring to FIG. 10, an alternative system for determining the SOC of battery 12 by relating the external operating conditions such as, e.g., discharge rate, cycle number, calendar life and recovery time to a specified open circuit voltage (OCV) after a deep discharge and environmental conditions such as, e.g., temperature, battery orientation, magnetic field and g-force, and which infer the discharge efficiency to its discharge efficiency, then adjusting the theoretical capacity accordingly is generally shown at 40. System 40 comprises battery system 12 for which SOC is to be determined, an operating characteristic processing unit 42 (for determining, e.g., discharge rate, $D_{Rate}$, and coulombs withdrawn from the battery, $C_w$) an environmental characteristic processing unit 44 (for determining, e.g., battery temperature $T_{batt}$), intelligent system 16 (for determining discharge efficiency, $D_{isseff}$) and a processing unit 46 for determining SOC.

Figure 11A:
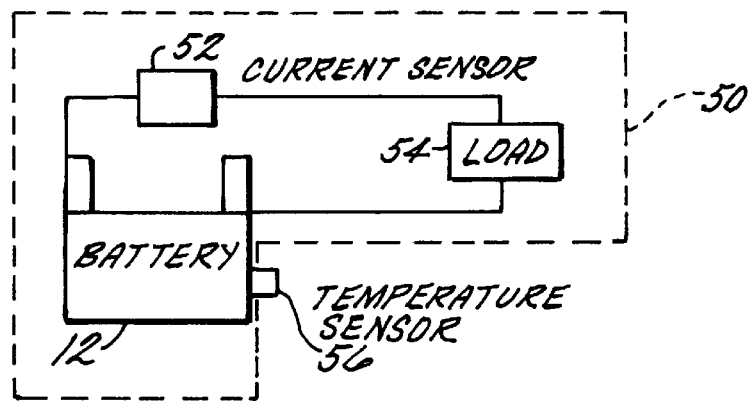
FIG. 11A is a circuit block diagram for sensing battery current in accordance with the present invention.

In this embodiment, intelligent system 16 is trained in the relationship between the external operating conditions and environmental conditions and the discharge efficiency, to compute battery discharge efficiency based on measurements of the current flow out of the battery, and the temperature of the battery. Referring to FIG. 11A, a circuit 50 for sensing battery current comprises a current sensor 52 which is connected in series between battery 12 and a load 54. The current to load 54 is measured in either direction, i.e., from load 54 to battery 12 or from battery 12 to load 54. Current sensor 52 may be a shunt resistor across which a voltage drop is measured, the magnitude and sign of the voltage drop being indicative of the magnitude and direction of the current flow. A temperature sensor 56 is attached to battery 12 so that it is in intimate thermal contact with battery 12.

Figure 12:
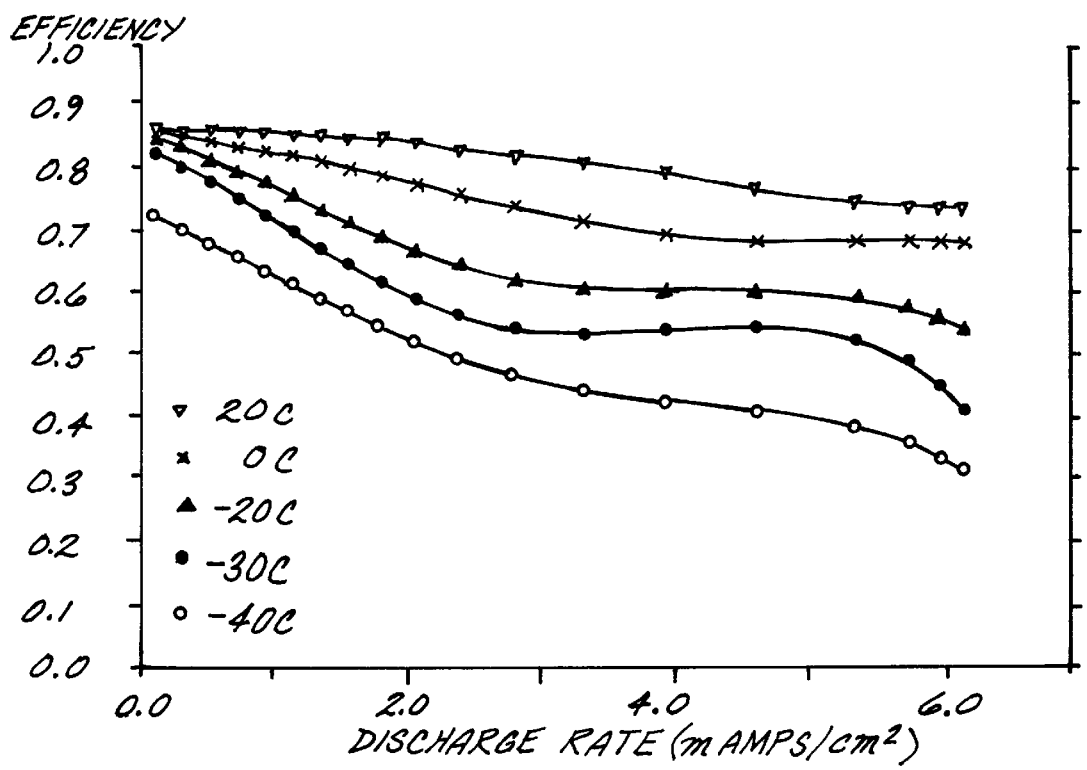
FIG. 12 is a plot of discharge efficiency as a function of current and temperature.

Referring to FIG. 12, discharge efficiency curves for primary $Li/SO_2$ batteries as a function of current (discharge rate) and temperature are shown. The discharge efficiency of the battery is a measure of the battery's capacity and varies with the battery's current and temperature. The discharge efficiency curves may be used to compensate for the available capacity for a battery depending on discharge rate and temperature conditions.

Figure 11B:
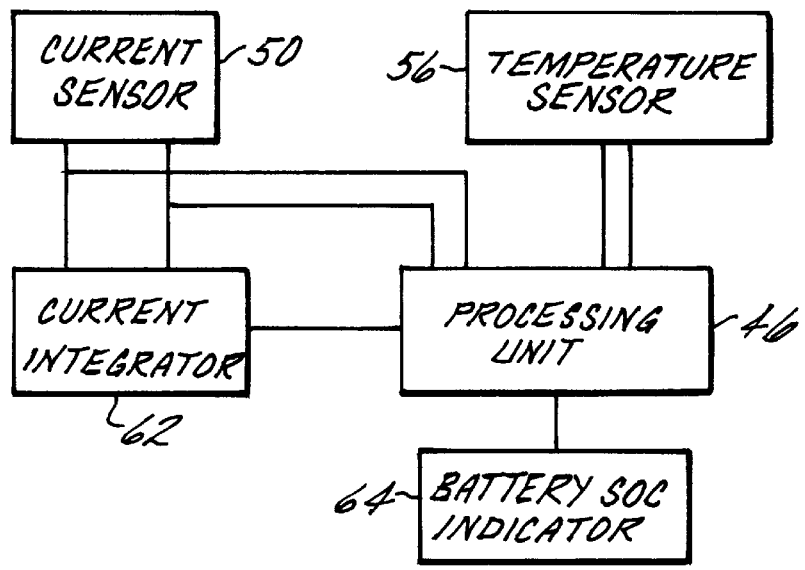
FIG. 11B is a circuit block diagram for determining state of charge as a function of time with varying current and temperature.

To determine the battery SOC as a function of time with varying current and temperature a circuit 60 (FIG. 11B) may be used. Circuit 60 comprises current sensor 50 which provides current information for use by processing unit 46 and is integrated over time in a current integrator 62 yielding the total charge consumed. When a total charge of one coulomb has been accumulated in current integrator 62, this charge is modified by the discharge efficiency and subtracted from the total charge previously stored. The modification of the charge is performed by simply dividing the one coulomb count by the discharge efficiency, in processing unit 46 (see U.S. Pat. No. 5,372,898 to Atwater which is incorporated herein by reference). Additionally, processing unit 46 determines the discharge efficiency during the one coulomb discharge cycle using fuzzy logic as described below. The fuzzy logic process for determining the discharge efficiency of the battery is also performed in processing unit 46. The calculation for reducing the stored available charge by the modified one coulomb charge (modified by the discharge efficiency of battery 12 during this particular discharge period) is also performed in processing unit 46. The available charge in the battery is the previous stored charge, which in the case of a fully charged battery is the nominal rated capacity, minus the charge removed from the battery which is the one coulomb charge modified by the discharge efficiency. The available charge is displayed on a battery state of charge indicator 64.

Figure 13:
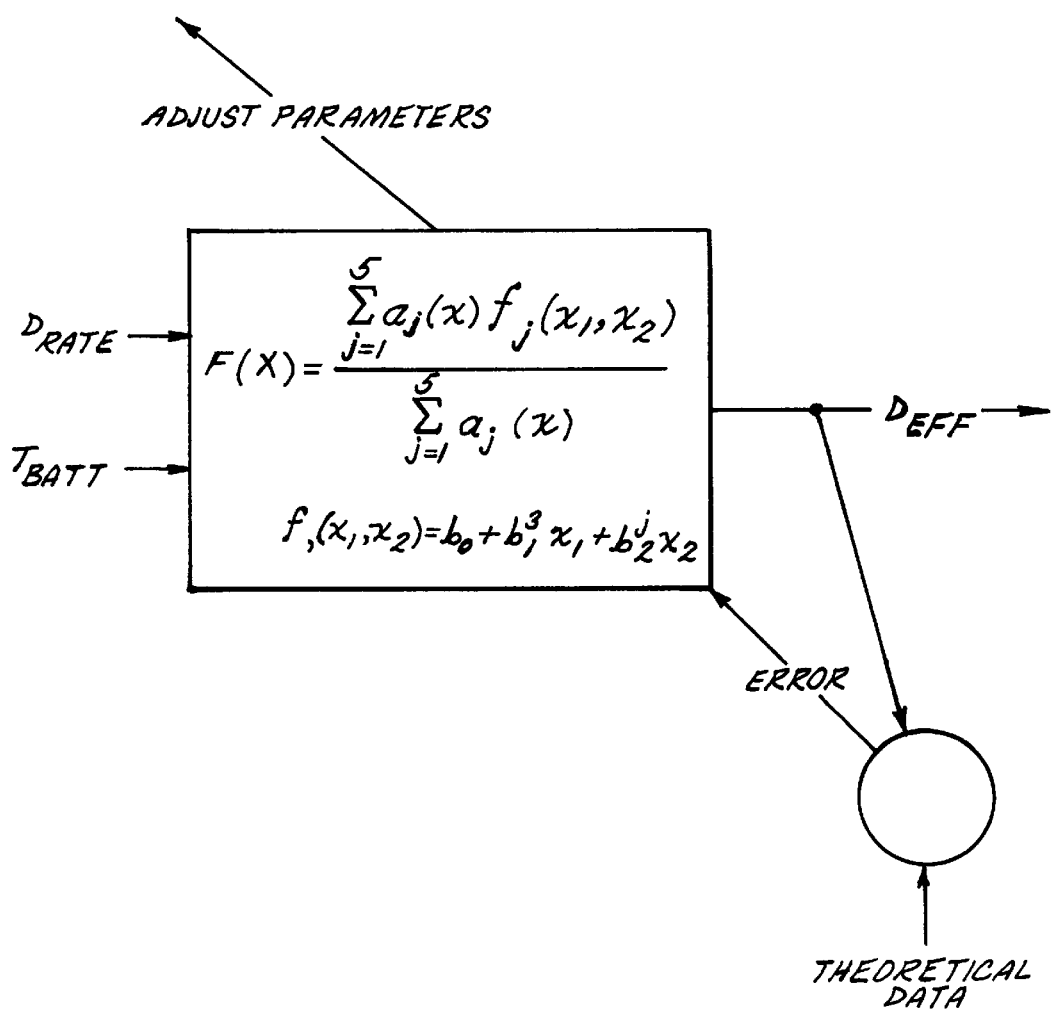
FIG. 13 is a block diagram of an additive fuzzy system for use in the intelligent system of the present invention.
Figure 14A:
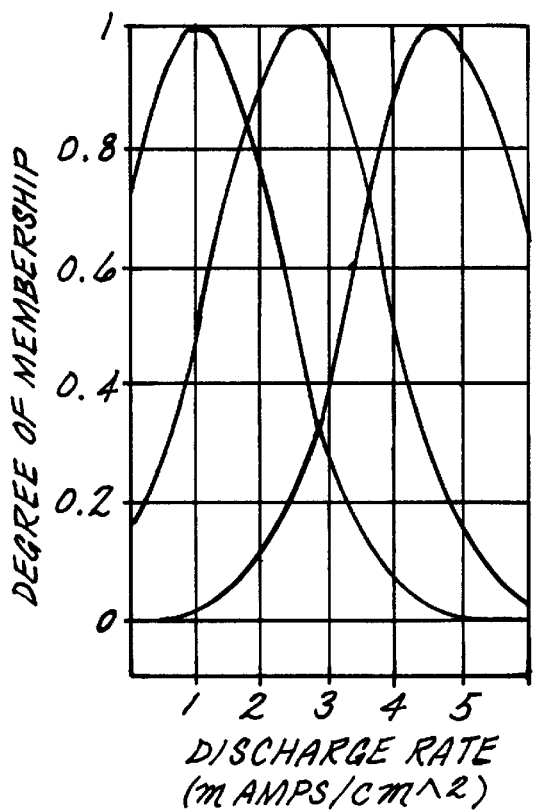
FIGS. 14A and B are plots of membership functions for the fuzzy system of FIG. 13.
Figure 14B:
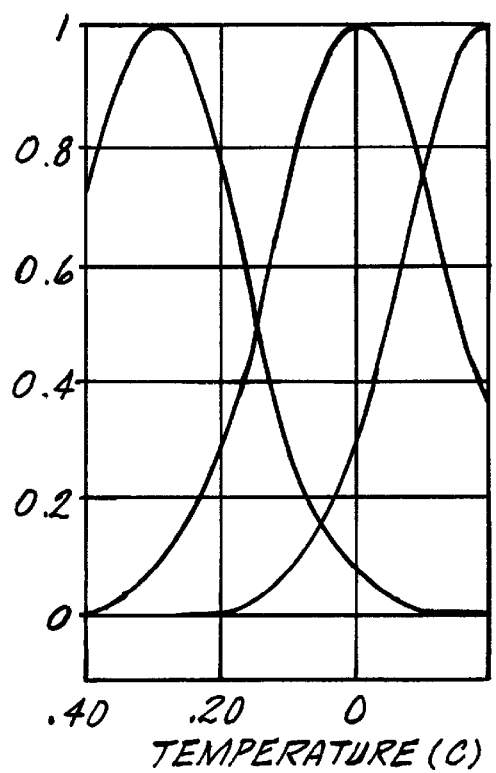

Referring to FIG. 13, a generalized additive fuzzy system, know as Sugeno Inference system (see Fuzzy Logic Toolbox, for use with MATLAB, The Mathworks, Inc. by Jang and Gulley also see, Lee, C. C., Fuzzy Logic In Control Systems: Fuzzy Controller—1 and 2, IEEE Transactions on Systems, Man and Cybernetics, Vol. 20, No. 2, p. 404–435, 1990) is generally shown, which learns the relationship between the input variables, discharge rate and battery temperature, and output variable, discharge efficiency. The subtractive clustering algorithm is used to develop the input membership functions, and the rules. The subtractive clustering algorithm determines where five clusters in the three-dimensional data (two inputs and one output) with each cluster representing a rule. The projection of each cluster onto each input space determines the position of each input membership function. Accordingly, there are five membership functions for both discharge rate and temperature. These membership functions (FIGS. 14A and B), some of these membership functions overlap. Therefore, there are three distant membership functions for discharge rate and two for temperature. Finally, a linear least squares method is used to determine coefficients of the output membership functions, further description of the subtractive clustering algorithm and the least squares method is found in Fuzzy Logic Toolbox, for use with MATLAB, The Mathworks, Inc. by Jang and Gulley.

Figure 11C:
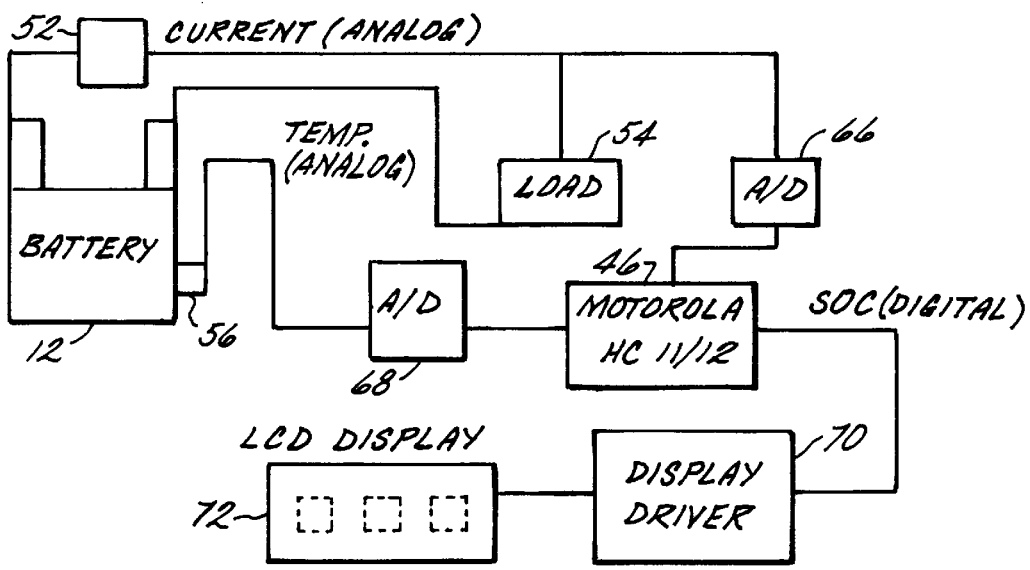
FIG. 11C is a circuit block diagram for determining state of charge in accordance with the present invention.

Referring to FIG. 11C, current from battery 12 to load 54 is sensed by a sensed resistor 52. A temperature sensor 56 (e.g., LM35) is used to measure the temperature of the battery case. These two analog signals are fed into analog-to-digital converters (A/D) 66 and 68 inputs to microcontroller 46. It will be noted that a Motorola 68HC12 microcontroller has the advantages of having fuzzy logic instructions built into the instruction set of the microcontroller.

The fuzzy logic model is used to determine discharge efficiency. Current integration is used to count charge up to a count of one coulomb. SOC is then computed by modifying the one coulomb counted charge by the discharge efficiency and subtracting this either from the nominal capacity (for the first calculation) or from the previous SOC for subsequent calculations. Current integration is performed digitally in microcontroller 46 using the sensed current and the counter on microcontroller 46. Digital SOC data is then transferred to a liquid crystal display driver 70 (e.g., AY0438) and on to the liquid crystal display 72. This display may be in the form of a bar graph or in the form of a 3½ digit character display.

Figure 15:
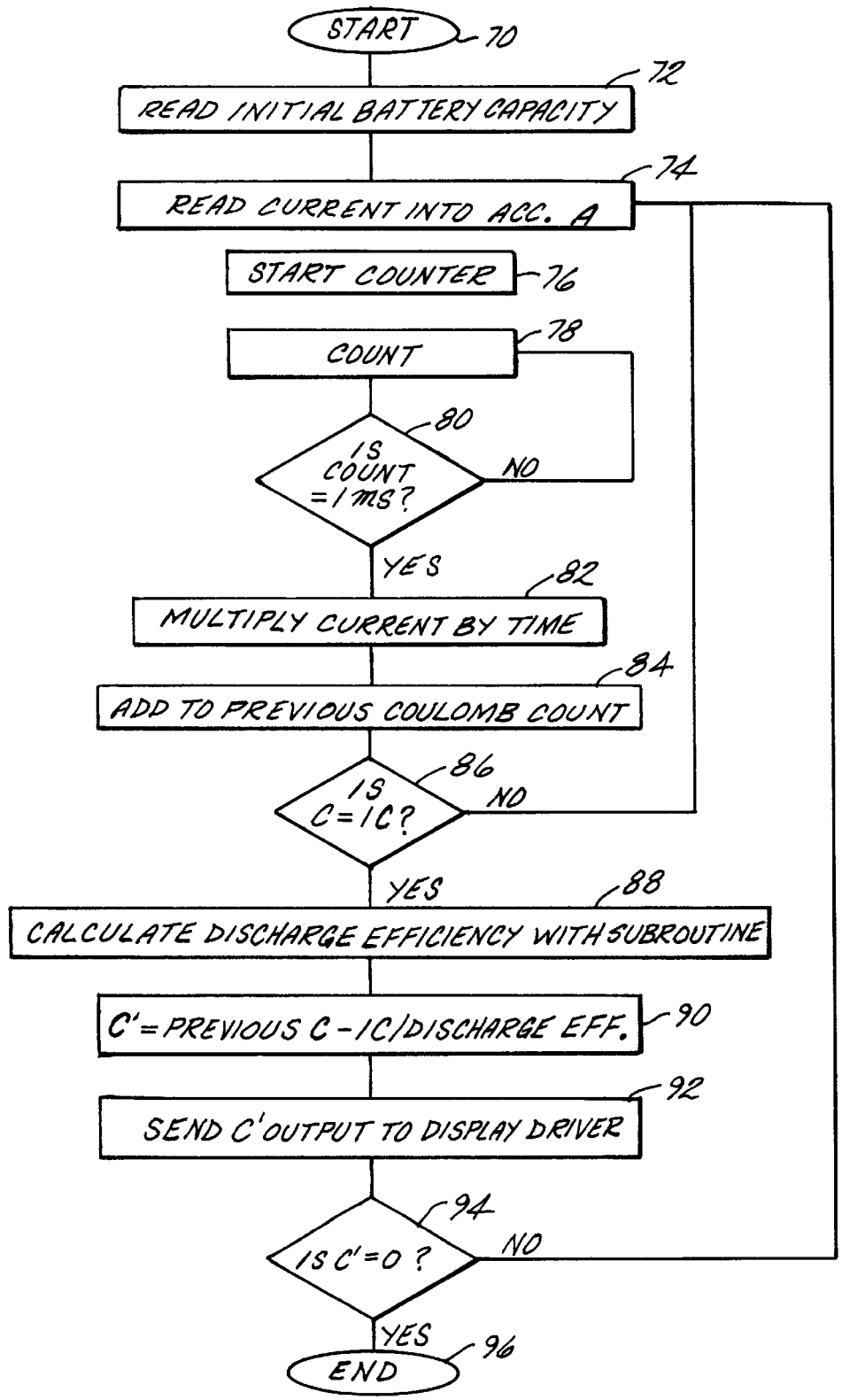
FIG. 15 is a flowchart of the method for determining state of charge of an electrochemical device in accordance with the present invention.

FIG. 15 shows a flowchart of the logical basis for the battery SOC determination. This program is initiated a block 70 then the initial battery capacity is read at block 72. Battery current is read into an accumulator A at block 74. A counter is then started at block 76 to provide a count (block 78). The count is monitored and when it reaches I ms the program continues (block 80). Then battery current is multiplied by time at block 82. This is then added to the previous Coulomb count at block 84. If Coulomb count is IC then the program continues (block 86), otherwise return to block 74. The discharge efficiency is calculated within a subroutine at block 88. The SOC is then determined at block 90 and sent to a display driver at block 92. If the SOC is zero (block 94) the program terminates (block 96), otherwise return to block 74.

Existing software microcontroller development tools are available for implementing the above steps, e.g., the software development tools for the Motorola 68HC11 microcontroller. These tools can be used to implement the software for taking the current measurements and for calculating battery SOC. To implement the fuzzy logic algorithm to determine the discharge efficiency of the primary $Li/SO_2$ cell, the software TILShell can be used together with the 68HC11 assembler program. For implementation of the code on the Motorola 68HC12 microcontroller, manual coding is required of the model developed using the fuzzy logic toolbox for MATLAB using the fuzzy logic instructions for the 68HC12. Alternatively, the FuzzyTECH software from Inform Software Corp. can be used to implement the fuzzy logic algorithm since this software already has the drivers to program the 68HC12 microcontroller.

While preferred embodiments have been shown and described, various modifications and substitutions may be made thereto without departing from the spirit and scope of the invention. Accordingly it is to be understood that the present invention has been described by way of illustrations and not limitation.

What is claimed is:

1. A method of determining a state of charge of an electrochemical device, comprising:
   detecting at least one internal characteristic of said electrochemical device; and
   determining said state of charge of said electrochemical device from an intelligent system trained in a relationship between said at least one internal characteristic and said state of charge.

2. The method of determining said state of charge of claim 1 further comprising:
   detecting at least one external characteristic of said electrochemical device; and wherein said determining said state of charge of said electrochemical device from said intelligent system further includes, said intelligent system trained in a relationship between said at least one external characteristic and said state of charge.

3. The method of determining said state of charge of claim 1 wherein said at least one internal electrical characteristic comprises at least one internal impedance of said electrochemical device.

4. The method of determining said state of charge of claim 3 wherein said at least one internal impedance comprises a first internal impedance at a first frequency.

5. The method of determining said state of charge of claim 4 wherein said at least one internal impedance further comprises a second internal impedance at a second frequency.

6. The method of determining said state of charge of claim 1 wherein said intelligent system comprises a fuzzy system.

7. The method of determining said state of charge of claim 6 wherein said fuzzy system comprises an additive fuzzy system.

8. The method of determining said state of charge of claim 7 wherein said additive fuzzy system mathematically comprises:

$$F(x) = \frac{\sum_{j=1}^{m} w_j a_j(x) V_j c_j}{\sum_{j=1}^{m} w_j a_j(x) V_j}$$

$$a_j(x) = \prod_{i=1}^{n} a_j^i(x_i)$$

$$B = \sum_{j=1}^{m} w_j B'_j = \sum_{j=1}^{m} w_j a_j(x) B_j$$

where,
$w_j$ is a weight of rule j,
$a_j^i$ represents if-part set function, membership function of input i of rule j on input i,
$a_j$ represents joint if-part set function, result of "$a_j^1$ 'and' $a_j^2$ ... 'and' $a_j^i$, that states a degree to which an input x belongs to the if-part fuzzy set $a_j$,
$B_j$ represents then-part set function, membership function j on an output,
$V_j$ is a finite positive volume or area of the then-part set $B_j$,
$c_j$ is a centroid of the then-part set $B_j$,
$B'_j$ is a scaled then-part set, scaled output membership function j, result of $a_j(x)B_j$, and
B is an output set prior to defuzzification.

9. The method of determining said state of charge of claim 3 wherein said at least one internal impedance includes a resistive part and a reactive part.

10. The method of determining said state of charge of claim 1 wherein said electrochemical device comprises a primary battery, a rechargeable battery, a fuel cell, a hybrid battery containing a fuel cell electrode or an electrochemical supercapacitor.

11. The method of determining said state of charge of claim 2 wherein said at least one external characteristic comprises an external operating condition and an environmental condition.

12. The method of determining said state of charge of claim 11 wherein said relationship between said at least on external characteristic and said state of charge includes:
   a relationship between said external operating condition and said environmental condition and a discharge efficiency of said electrochemical device.

13. The method of determining said state of charge of claim 12 wherein said external operating condition comprises current flow from said electrochemical device and said environmental condition comprises temperature of said electrochemical device.

14. The method of determining said state of charge of claim 12 wherein said relationship between said at least on external characteristic and said state of charge further includes:
   a relationship between said discharge efficiency and said state of charge.

15. The method of determining said state of charge of claim 7 wherein said additive fuzzy system includes a subtractive clustering algorithm for developing input membership functions and rules.

16. A system for determining a state of charge of an electrochemical device, comprising:
   a sensor for detecting at least one internal characteristic of said electrochemical device and providing an internal sensed signal indicative thereof; and
   a signal processor responsive to said internal sensed signal for providing a state of charge signal, said signal processor including an intelligent system trained in a relationship between said at least one internal characteristic and said state of charge for determining said state of charge of said electrochemical device.

17. The system for determining said state of charge of claim 16 further comprising:
   a sensor for detecting at least one external characteristic of said electrochemical device and providing an external sensed signal indicative thereof; and
   wherein said signal processor is also responsive to said external sensed signal for determining said state of charge of said electrochemical device, said signal processor including said intelligent system which is further trained in a relationship between said at least one external characteristic and said state of charge.

18. The system for determining said state of charge of claim 16 wherein said at least one internal electrical characteristic comprises at least one internal impedance of said electrochemical device.

19. The system for determining said state of charge of claim 18 wherein said at least one internal impedance comprises a first internal impedance at a first frequency.

20. The system for determining said state of charge of claim 19 wherein said at least one internal impedance further comprises a second internal impedance at a second frequency.

21. The system for determining said state of charge of claim 16 wherein said intelligent system comprises a fuzzy system.

22. The system for determining said state of charge of claim 21 wherein said fuzzy system comprises an additive fuzzy system.

23. The system for determining said state of charge of claim 22 wherein said additive fuzzy system mathematically comprises:

$$F(x) = \frac{\sum_{j=1}^{m} w_j a_j(x) V_j c_j}{\sum_{j=1}^{m} w_j a_j(x) V_j}$$

$$a_j(x) = \prod_{i=1}^{n} a_j^i(x_i)$$

$$B = \sum_{j=1}^{m} w_j B'_j = \sum_{j=1}^{m} w_j a_j(x) B_j$$

where, $w_j$ is a weight of rule j, $a_j^i$ represents if-part set function, membership function of input i of rule j on input i, $a_j$ represents joint if-part set function, result of "$a_j^1$ 'and' $a_j^2$ ... 'and' $a_j^i$", that states a degree to which an input x belongs to the if-part fuzzy set $a_j$, $B_j$ represents then-part set function, membership function j on an output, $V_j$ is a finite positive volume or area of the then-part set $B_j$, $c_j$ is a centroid of the then-part set $B_j$, $B'_j$ is a scaled then-part set, scaled output membership function j, result of $a_j(x)B_j$, and B is an output set prior to defuzzification.

24. The system for determining said state of charge of claim 18 wherein said at least one internal impedance includes a resistive part and a reactive part.

25. The system for determining said state of charge of claim 16 wherein said electrochemical device comprises a primary battery, a rechargeable battery, a fuel cell, a hybrid battery containing a fuel cell electrode or an electrochemical supercapacitor.

26. The system for determining said state of charge of claim 17 wherein said at least one external characteristic comprises an external operating condition and an environmental condition.

27. The system for determining said state of charge of claim 26 wherein said relationship between said at least on external characteristic and said state of charge includes:

a relationship between said external operating condition and said environmental condition and a discharge efficiency of said electrochemical device.

28. The system for determining said state of charge of claim 27 wherein said external operating condition comprises current flow from said electrochemical device and said environmental condition comprises temperature of said electrochemical device.

29. The system for determining said state of charge of claim 27 wherein said relationship between said at least on external characteristic and said state of charge further includes:

a relationship between said discharge efficiency and said state of charge.

30. The system for determining said state of charge of claim 22 wherein said additive fuzzy system includes a subtractive clustering algorithm for developing input membership functions and rules.

31. The system for determining said state of charge of claim 16 further comprising:

a display responsive to said state of charge signal for displaying said state of charge.

32. A method of determining a state of charge of an electrochemical device, comprising:

detecting at least one characteristic of said electrochemical device; and determining said state of charge of said electrochemical device from a fuzzy system trained in a relationship between said at least one characteristic and said state of charge.

33. The method of determining said state of charge of claim 32 wherein said at least one characteristic comprises at least one external characteristic.

34. A system for determining a state of charge of an electrochemical device, comprising:

a sensor detecting at least one characteristic of said electrochemical device and providing a sensed signal indicative thereof; and a signal processor responsive to said sensed signal for determining said state of charge of said electrochemical device and providing a state of charge signal, said signal processor including a fuzzy system trained in a relationship between said at least one characteristic and said state of charge.

35. The system for determining said state of charge of claim 34 wherein said at least one characteristic comprises at least one external characteristic.

36. A method of determining a state of charge of an electrochemical device, comprising:

detecting at least one internal characteristic of said electrochemical device; and determining said state of charge of said electrochemical device from an intelligent system trained in a relationship between said at least one internal characteristic and said state of charge, said intelligent system comprising an additive fuzzy system, and said additive fuzzy system mathematically comprising:

$$F(x) = \frac{\sum_{j=1}^{m} w_j a_j(x) V_j c_j}{\sum_{j=1}^{m} w_j a_j(x) V_j}$$

$$a_j(x) = \prod_{i=1}^{n} a_j^i(x_i)$$

$$B = \sum_{j=1}^{m} w_j B'_j = \sum_{j=1}^{m} w_j a_j(x) B_j$$

where, $w_j$ is a weight of rule j, $a_j^i$ represents if-part set function, membership function of input i of rule j on input i, $a_j$ represents joint if-part set function, result of "$a_j^1$ 'and' $a_j^2$ ... 'and' $a_j^i$", that states a degree to which an input x belongs to the if-part fuzzy set $a_j$, $B_j$ represents then-part set function, membership function j on an output, $V_j$ is a finite positive volume or area of the then-part set $B_j$, $c_j$ is a centroid of the then-part set $B_j$, $B'_j$ is a scaled then-part set, scaled output membership function j, result of $a_j(x)B_j$, and B is an output set prior to defuzzification.

37. A method of determining a state of charge of an electrochemical device, comprising:

detecting at least one internal characteristic of said electrochemical device; and determining said state of charge of said electrochemical device from an intelligent system trained in a relationship between said at least one internal characteristic and said state of charge, said intelligent system comprising an additive fuzzy system, and said additive fuzzy system including a subtractive clustering algorithm for developing input membership functions and rules.

38. A system for determining a state of charge of an electrochemical device, comprising:

a sensor for detecting at least one internal characteristic of said electrochemical device and providing an internal sensed signal indicative thereof; and a signal processor responsive to said internal sensed signal for determining said state of charge of said electrochemical device and providing a state of charge signal, said signal processor including an intelligent system trained in a relationship between said at least one internal characteristic and said state of charge, said intelligent system comprising an additive fuzzy system, said additive fuzzy system mathematically comprising:

$$F(x) = \frac{\sum_{j=1}^{m} w_j a_j(x) V_j c_j}{\sum_{j=1}^{m} w_j a_j(x) V_j}$$

$$a_j(x) = \prod_{i=1}^{n} a_j^i(x_i)$$

$$B = \sum_{j=1}^{m} w_j B'_j = \sum_{j=1}^{m} w_j a_j(x) B_j$$

where, $w_j$ is a weight of rule j, $a_j^i$ represents if-part set function, membership function of input i of rule j on input i, $a_j$ represents joint if-part set function, result of "$a_j^1$ 'and' $a_j^2$ ... 'and' $a_j^i$, that states a degree to which an input x belongs to the if-part fuzzy set $a_j$, $B_j$ represents then-part set function, membership function j on an output, $V_j$ is a finite positive volume or area of the then-part set $B_j$, $c_j$ is a centroid of the then-part set $B_j$, $B'_j$ is a scaled then-part set, scaled output membership function j, result of $a_j(x)B_j$, and B is an output set prior to defuzzification.

39. A system for determining a state of charge of an electrochemical device, comprising:

a sensor for detecting at least one internal characteristic of said electrochemical device and providing an internal sensed signal indicative thereof; and a signal processor responsive to said internal sensed signal for determining said state of charge of said electrochemical device and providing a state of charge signal, said signal processor including an intelligent system trained in a relationship between said at least one internal characteristic and said state of charge, said intelligent system comprising an additive fuzzy system, said additive fuzzy system including a subtractive clustering algorithm for developing input membership functions and rules.

* * * * *

UNITED STATES PATENT AND TRADEMARK OFFICE
CERTIFICATE OF CORRECTION

PATENT NO : 6,011,379
DATED : January 4, 2000
INVENTOR(S): Pritpal Singh and Craig Fennie, Jr.

It is certified that error appears in the above-identified patent and that said Letters Patent is hereby corrected as shown below:

The following is to be inserted after the title:

--This invention was made with Government support under contract USZA22-97-P-0010 awarded by the U.S. Department of Defense. The Government has certain rights in the invention.--

Signed and Sealed this

Eighth Day of May, 2001

*Attest:*

NICHOLAS P. GODICI

*Attesting Officer*  Acting Director of the United States Patent and Trademark Office